US008754629B2

(12) United States Patent
Govier et al.

(10) Patent No.: US 8,754,629 B2
(45) Date of Patent: Jun. 17, 2014

(54) ELECTRICAL HAZARD WARNING IN AUDIO SIGNAL PROBE (75) Inventors: Mark Samuel Govier, Cardiff (GB); Sandeep Nagaraj Kabadi, Bangalore (IN); Benjamin Vijay Visuvasam, Bangalore (IN)

(73) Assignee: Greenlee Textron Inc., Rockford, IL (US)

( * ) Notice: Subject to any disclaimer, the term of this patent is extended or adjusted under 35 U.S.C. 154(b) by 216 days.

(21) Appl. No.: 13/305,056

(22) Filed: Nov. 28, 2011

(65) Prior Publication Data
US 2013/0134960 A1 May 30, 2013

(51) Int. Cl.
*G01R 19/00* (2006.01)
*G01R 31/02* (2006.01)
*G01R 31/08* (2006.01)
*G01R 1/067* (2006.01)

(52) U.S. Cl.
CPC ............ *G01R 31/021* (2013.01); *G01R 31/023* (2013.01); *G01R 31/08* (2013.01); *G01R 1/06788* (2013.01)
USPC .......................................... 324/66; 324/542

(58) Field of Classification Search
USPC ............ 324/66, 67, 528, 527, 523, 512, 500, 324/539, 542, 543, 754.01, 76.11, 149, 324/76.57; 340/4.4, 328, 384.1, 384.4
See application file for complete search history.

(56) References Cited

U.S. PATENT DOCUMENTS

| | | | |
|---|---|---|---|
| 3,882,287 A * | 5/1975 | Simmonds ...................... 379/25 |
| 5,057,848 A * | 10/1991 | Rankin et al. ................. 343/703 |
| 5,577,099 A | 11/1996 | Clement et al. |
| 5,887,051 A | 3/1999 | Sullivan et al. |
| 6,466,029 B2 * | 10/2002 | Stroth et al. .................. 324/509 |
| 6,946,850 B2 * | 9/2005 | Siglinger et al. .............. 324/613 |
| 7,116,093 B2 * | 10/2006 | Johnson et al. ............ 324/76.28 |
| 7,733,078 B2 | 6/2010 | Duke |
| 2006/0208744 A1 | 9/2006 | Zusman |
| 2010/0176794 A1 | 7/2010 | Tsen et al. |

OTHER PUBLICATIONS

International Search Report and Written Opinion PCT/US12/66631, Feb. 11, 2013.
Greenlee Communications Limited; TP 500J & TP 510J (Tone Probe 500J & 510J) Operating Instructions; Dated Feb. 2011; 2 pages.

(Continued)

*Primary Examiner* — Hoai-An D Nguyen
(74) *Attorney, Agent, or Firm* — Klintworth & Rozenblat IP LLC (57) ABSTRACT

An audio tone probe is used by a technician to identify a conductor carrying an applied tracing tone signal. A probe tip is positioned proximate a conductor. A mains warning circuit and a tracing circuit are provided in communication with the probe tip and a speaker is provided in communication with the mains warning and tracing circuits. Signals detected by the probe tip are provided to the mains warning circuit and the tracing circuit. The mains warning circuit determines whether a mains signal is present in the detected signal and activates a warning generator if a mains signal is present. The tracing circuit filters mains signals from the detected signals. A tracing circuit output provides a tone generating signal to the speaker for use in identifying the presence of the applied tracing tone. The probe incudes a test tone generator to verify that the probe is operational.

20 Claims, 11 Drawing Sheets

(56) References Cited

OTHER PUBLICATIONS

Greenlee 200XP and 200XP/50 Filtered Tone Probes Instruction Manual; Greenlee Textron Inc. 2009 (2 pages).
Greenlee GT-12 Voltage Detector Instruction Manual; Greenlee Textron Inc. 2010 (6 pages).
Greenlee PDMM-20 Multimeter Instruction Manual; Greenlee Textron Inc. 2004 (64 pages).
Fluke 1AC II VoltAlert Instruction Sheet; Jul. 2009 Fluke Corporation (12 pages).

* cited by examiner

FIG. 9

ELECTRICAL HAZARD WARNING IN AUDIO SIGNAL PROBE

FIELD OF THE INVENTION

The field of the invention is audio tone probe used in connection with telecommunication circuits for tracing conductors.

BACKGROUND OF THE INVENTION

Devices used to trace and detect audio signals in metallic conductors are commonly referred to as tone probes, audio tone probes, inductive amplifiers, etc. These devices are used by telecommunication, LAN, WAN or cable technicians to identify, trace and locate a particular conductor. In particular these devices are used to identify opposite ends of a conductor wherein only the ends of the conductor are visible or accessible. An audio tone probe is used in conjunction with a tone generator. Specifically, the tone generator is used to send a tracing tone signal over a conductor at a first location, the signal having either a single frequency or having multiple frequencies. The tracing tone signal is carried by the conductor to be traced to a second location where the conductor is to be identified using the audio tone probe. The conductor to be identified may, for example, be in a cable and therefore maybe present along with many other nearby metal conductors or wires. Often other wires and conductors are carrying other signals, such as for example, electrical AC or DC control signals, etc. Occasionally faults may occur that cause unexpected voltages to be present on the conductor to be traced, for example, non-telecommunication signals or even AC mains power may be present on the conductor to be traced. These signals may be hazardous to the technician. Thus, the need for detection of hazardous voltages on the conductors arises in order to warn the technician of these hazardous voltages while they are tracing or identifying the desired metal conductors.

Conventional tone probes used to identify the conductor carrying the tracing tone signal may be either of the unfiltered type or the filtered type. Alternatively, a conventional tone probe may include both unfiltered or filtered modes, allowing the user to select either a filtered mode or an unfiltered mode of operation.

An unfiltered tone probe receives electrical signals in a particular frequency range and converts all of the received electrical signals to an audio signal. The received signals may include for example, the applied tone signal, noise, mains, etc. When working with communications cabling such as that for a telephone system, there is often a risk that a cable carrying mains has accidentally come in contact with the communications cabling. With an unfiltered probe, the probe will receive the tracing tone signal, noise, and a "mains hum" or buzzing sound which results from the mains signal. This mains hum may also be present in many locations which are near electrical equipment. A skilled technician may be able to differentiate between the conductor carrying the tracing tone signal from the conductor carrying hazardous electrical voltages by listening to the mains hum while tracing the conductors. Thus, the mains hum can be utilized by the technician as an indication that the conductor may be carrying potentially hazardous voltages. If the noise level (e.g. electrical buzz from ambient noise from nearby conductors) is greater than the tracing tone signal level, it becomes difficult for the technician to trace or locate the desired conductor (i.e. the conductor to which the tracing tone signal is applied).

Filter audio tone probes utilize filtration techniques to make the signal of interest, e.g. the tracing tone signal, more distinctive and therefore easier to differentiate from the noise or unwanted electrical signals. Examples of filtered audio tone probes include the instruments sold by Greenlee Textron, Inc. under the names 500J and 200 XP. U.S. Pat. No. 5,557,099 to Clement and Clark, for example, discloses a tone probe which utilizes selective filtering technology.

Filtration suppresses the ambient or noise induced as a result of nearby electrical conductors or hazardous conductors through band pass filtration or comb filtration techniques or a combination of these techniques. Using these filtration techniques, the noise and "mains hum" is removed from the audio path making it easier to detect the tracing signal tone and thereby identify the desired conductor. Filtering the mains hum, however, increases the probability that the unskilled technician will come in contact with hazardous conductors while tracing the conductors. Because the mains hum which is induced in the conductor is filtered from the audio tone received by the technician, the technician does not receive warning of the presence of hazardous voltages on the conductor. Thus, if a technician intends to use a filtered tone probe for tracing a conductor, the technician should in order to avoid hazardous conditions, also use a mains-rated multimeter. Use of a mains-rated multimeter or non-contact AC voltage detector will inform the technician as to whether hazardous AC mains voltages are present before using communications test equipment, such as for example, a filtered tone probe. Examples of non-contact AC voltage detectors include Greenlee's GT-11 and GT-12 devices.

One problem with using a mains-rated multimeter or non-contact voltage detector for testing for hazardous voltages prior to utilizing communications test equipment is that the technician is required to obtain and carry additional equipment. In addition, the technician is required to perform a preliminary step (i.e. test for mains) prior to tracing the conductor.

Pair tracing probe manufacturers have attempted to avoid mains and other noise signals by using alternative signal processing techniques. One alternative techniques involves the generation of special signals which are not reproduced directly but rather are reproduced by creating a representation of the generated signal. This technique is not intuitive and the response time of the detection algorithms is slow which leads to confusing results.

Accordingly, a need exists for an apparatus and method for tracing tones on a conductor while at the same time providing the user with a warning of hazardous voltages on the conductor. Additionally, a need exists for providing the user with assurances with respect to the integrity of the apparatus.

SUMMARY OF THE INVENTION

The present invention relates generally to an audio tone probe which allows a technician to identify a conductor to which a tracing tone signal has been applied and which readily warns the technician of hazardous conductors. The electromagnetic signals induced on the audio tone probe tip are processed via a tracing circuit which allows the technician to trace the conductors for the applied tracing tone. The electromagnetic signals induced on the audio tone probe tip are also processed via a mains detection circuit to identify and warn of hazardous conditions on the conductor.

The probe provides assurances of the system integrity by internally generating a test tone within audio range of the probe and applying the test tone to the probe tip. The test tone is made audible to the user to provide a means to test if audio tone probe is operational.

DETAILED DESCRIPTION OF PREFERRED EMBODIMENTS

While the present invention is susceptible of embodiment in various forms, as shown in the drawings, hereinafter will be described the presently preferred embodiments of the invention with the understanding that the present disclosure is to be considered as an exemplification of the invention, and is not intended to limit the invention to specific embodiments illustrated.

Figure 1A:
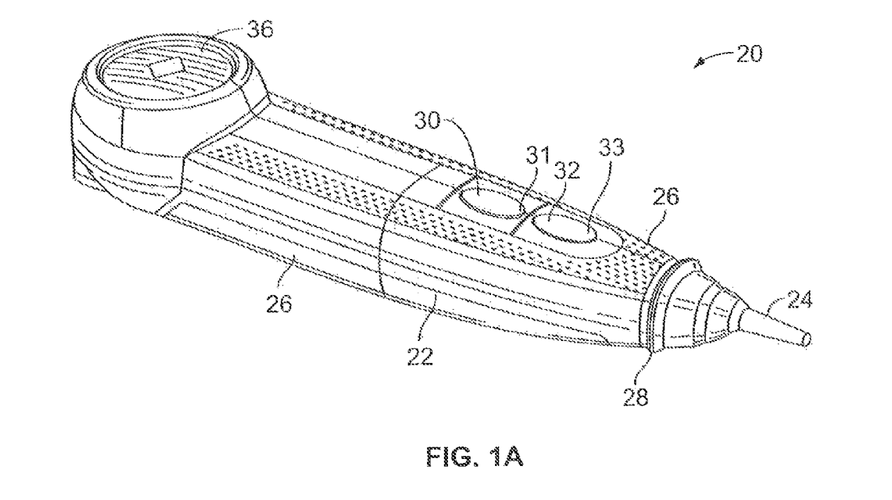
FIG. 1a is a perspective view of a probe of the present invention.
Figure 1B:
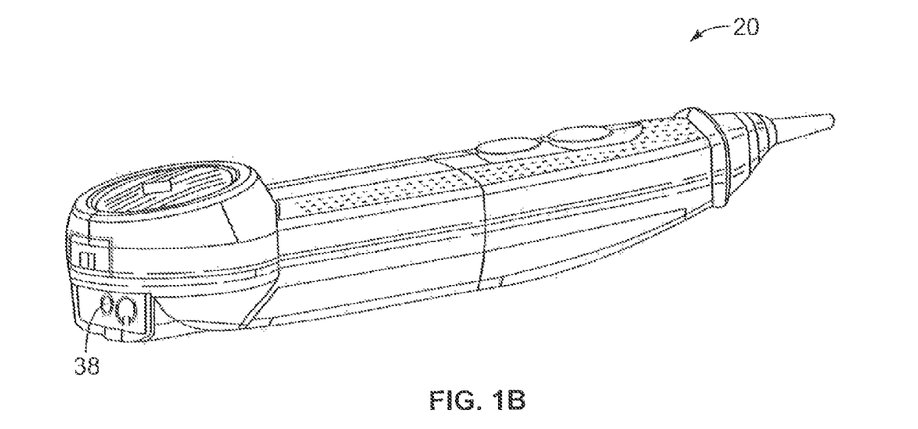
FIG. 1b is an alternate perspective view of a probe of the present invention.

FIG. 1a illustrates an audio tone probe 20 for use in determining whether a tone signal or any other electrical hazardous signal is being passed through a conductor such as a telephone or electrical wire. The audio tone probe 20 generally includes an insulative housing 22 and an electrically conductive tip 24 positioned at the forward end of the insulative housing 22. In the embodiment illustrated, the audio tone probe 20 is provided as a battery-operated, hand-held device and includes a battery cover 26 for providing access to the battery. The insulative housing 22 includes a textured gripping portion 26, a finger guard 28 extending from the housing, push buttons 30, 32, LEDs 31, 33 which shine through a translucent keymat forming the push buttons 30, 32, a speaker portion 36, and a headset connection 38 (See FIG. 1b).

Figure 2:
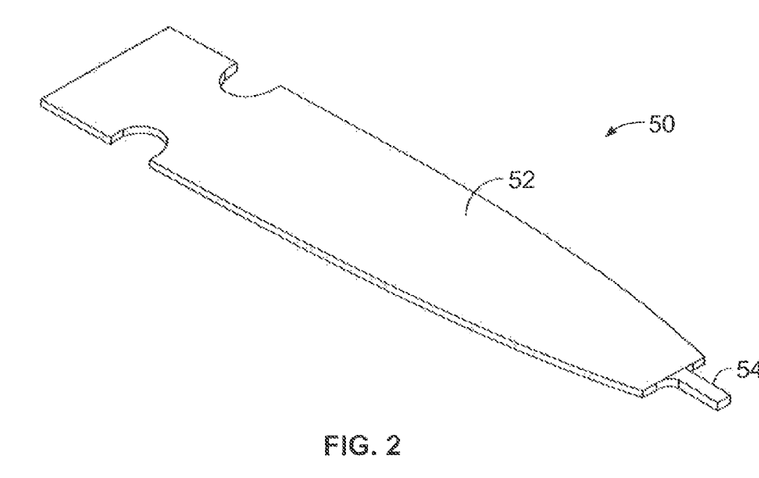
FIG. 2 depicts the shape of printed circuit board of the present invention which provides circuitry for detecting audio tones.
Figure 3:
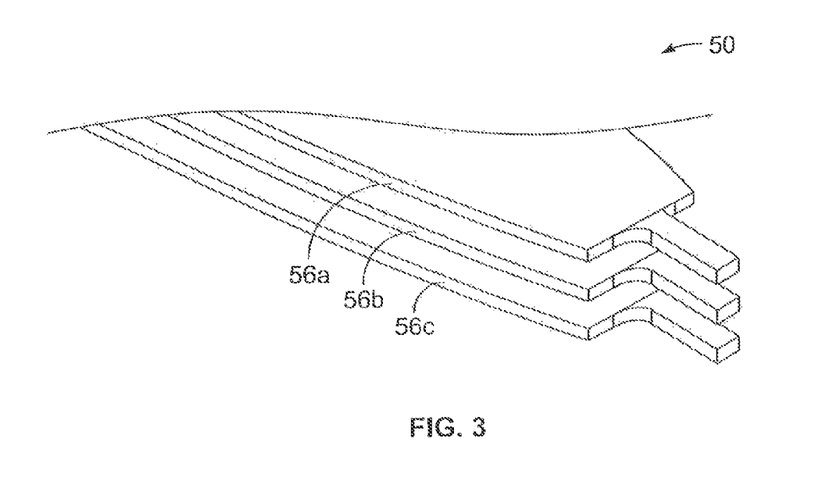
FIG. 3 depicts internal layers of the printed circuit board which contact the probe antenna.

The housing 22 houses a printed circuit board (PCB) 50 which provides circuitry for the probe 20. The shape of the PCB 50 is generally illustrated in FIG. 2. The PCB 50 generally includes a body 52 and a tip portion 54. As illustrated in FIG. 3, a plurality of layers 56a-56c form the PCB 50. The tip portion 54 of the PCB 50 resides within the tip 24 of the probe 20. Areas of the tip 54 on layers 56a and 56c are exposed and make electrical contact with the external tip 24. If required, layer 56b can carry a TESTTONE signal to the tip to prove integrity of the signal amplifier chain from the start to the end.

Figure 4:
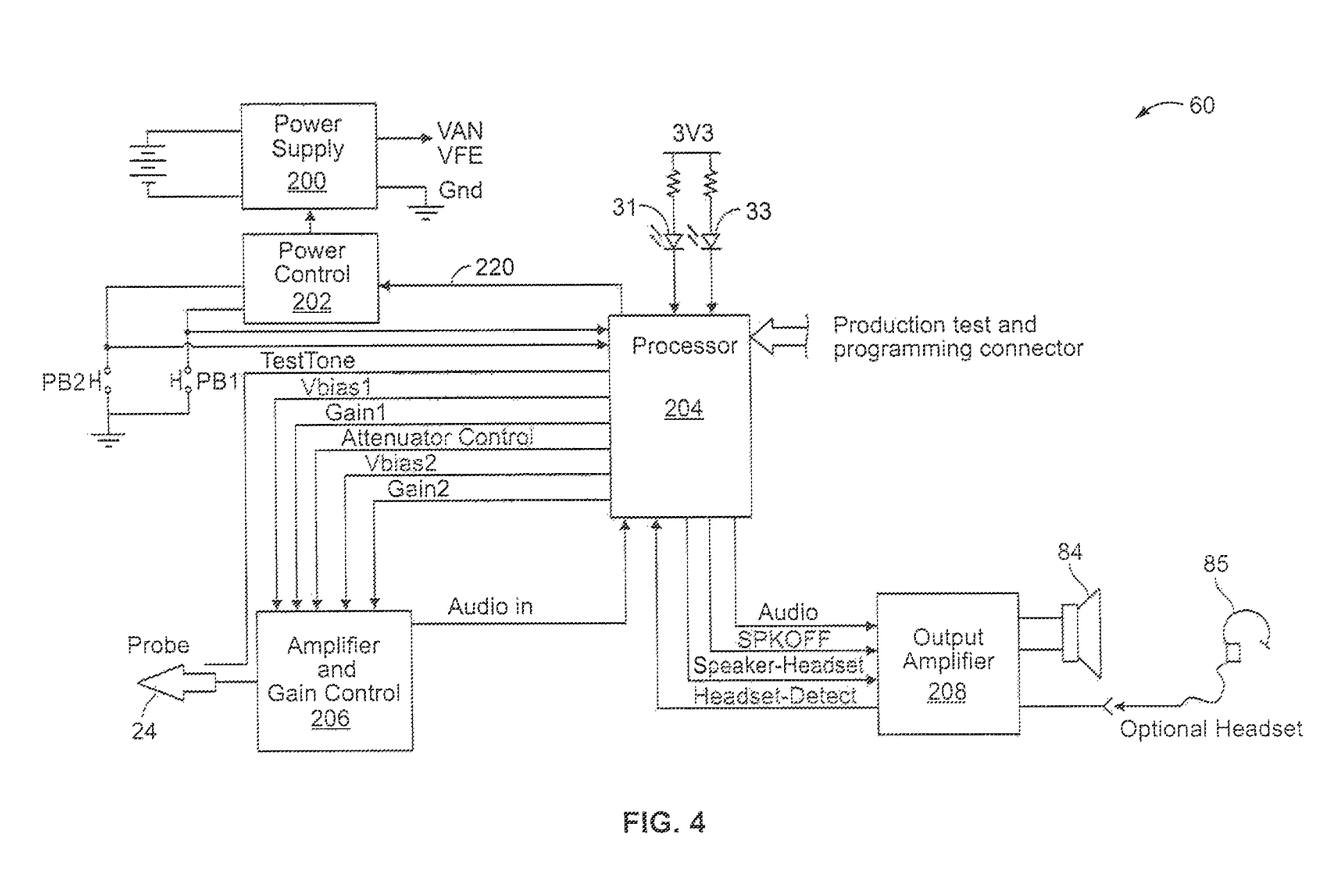
FIG. 4 is an electrical block diagram of the probe.

A block diagram of the circuit 60 of the probe 20 is illustrated in FIG. 4 which provides an overview of the circuitry of the probe 20. The circuit generally includes a power supply unit 200, a power control circuit 202, a processor circuit 204, an amplifier and gain control circuit 206 (see FIG. 5a) and an output amplifier circuit 208.

The power supply unit 200 is battery-operated and provides a supply voltage VFE. The power control circuit 204 includes printed circuit contact PB1 and PB2. Upon depressing PB1 and/or PB2 a signal 220 is provided from the processor circuit 204 to enable the power supply circuit 200. The amplifier and gain control circuit 206 is in electrical communication with the probe tip 24. A first voltage bias signal Vbias1 along with a first voltage gain control signal Gain1 are provided by the processor circuit 204 to a first stage amplifier; an attenuator control signal AttenuatorControl is provided to a potentiometer to control the attenuation of the first stage amplifier; and a second voltage bias signal Vbias2 along with a second voltage gain control signal Gain2 are provided by the processor circuit 204 to a second stage amplifier. Signals detected by the probe are amplified by the amplifier and control signal 206 and an output signal AUDIOIN is provided from the amplifier and gain control circuit 206 to the processor circuit 204.

The processor circuit 204 samples the signal AUDIOIN and applies digital signal processing (DSP) to the data. A connector is provided to the processor circuit 204 to allow for production testing and programming of the probe 20. The processing provided by the processor circuit 204 includes processing to provide mains warning and processing of the tracing signal as will be described in further detail below. LED's 31 and 33 are provided in communication with the processor circuit 204 to provide visual indication to the technician as will be described in further detail below. The processor 204 provides a signal TESTTONE which is sensed by the probe 24, provided to the amplifier and gain control circuit 206 and processed by the processor 204 to provide an indication that the probe 20 is performing as designed. As a result of the digital signal processing of the processor circuit 204 an audio signal is provided to the output amplifier 208.

The output amplifier 208 is in electrical communication with a speaker 84 and an optional headset 85. Upon connection of a headset 85 to the probe 20, a signal HEADSETDETECT is provided to the processor 204 and in turn the processor 204 provides a signal to the output amplifier 208 indicating that an output signal is to be provided to the headset 85 rather than the speaker 84. A signal AMPLIFIER CONTROL is provided by the processor circuit 204 to turn off the output amplifier 208.

Details of a first embodiment of the circuit 60 illustrated in FIG. 4 are illustrated in FIGS. 5a-5e.

Power Supply Circuit

Figure 5A:
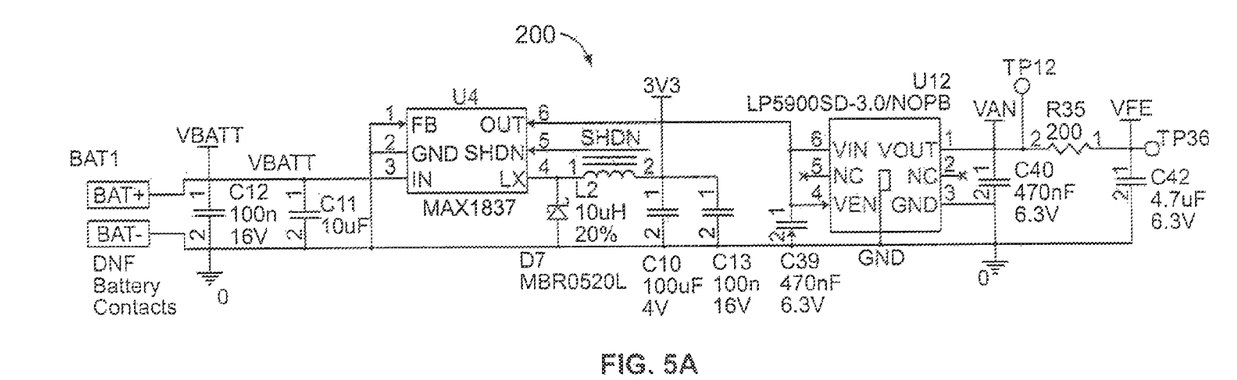
FIG. 5a is a detailed schematic of the power supply portion of the circuit of an embodiment of the probe.

As illustrated in FIG. 5a, the power supply circuit 200 includes regulators U4 and U12, capacitors C11, C12, C10, C13, C39, C40, and C42, inductor L2, diode D7, and resistor R35.

The regulator U4 converts power from a battery BAT1, which is a small 9V dry cell, to 3.3V at pin 6 of U4 using a switching regulator system. Pin 1 of regulator U4 is grounded to provide a fixed 3.3 output 3V3. Regulator U12 is a small linear regulator, preferably a low drop-out regulator, that drops the 3.3V at pin 6 of U4 to 3.0V at pin 1 of U12, referenced as supply voltage VAN in the schematic. In the process of dropping the voltage from 3.3V to 3.0V, switching noise is removed from the resulting supply voltage VAN. The supply voltage VAN is further filtered by R35 and C42 to provide the filtered supply voltage VFE. Thick traces are provided to U4, pin 3, U4, pin 4, D7, L2, C10, C13 and ground back to a common "star" point between D7 and C10 as near the as possible to the connection between the battery terminals and the ground plane.

Power Control Circuit

Figure 5B:
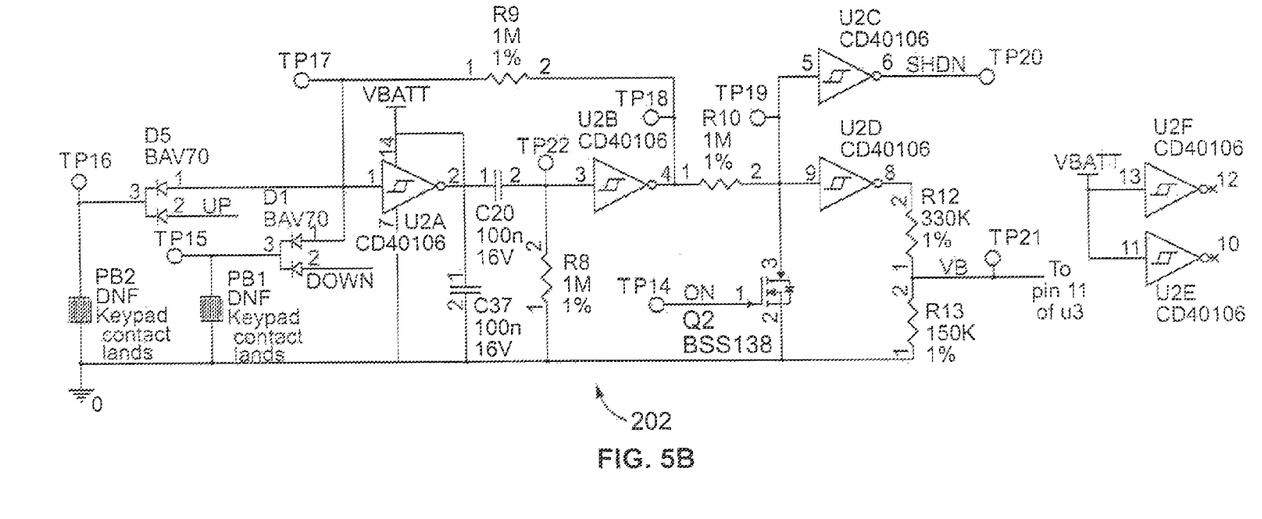
FIG. 5b is a detailed schematic of the control and power switching portion of the circuit of an embodiment of the probe.

As illustrated in FIG. 5b, the power control circuit 202 generally includes first and second printed circuit board contacts PB1 and PB2; diodes D1 and D5; logic inverters U2A, U2B, U2C, and U2D; resistors R8, R9, R10, R12, and R13; capacitors C20 and C37; and switch Q2. U2A, U2B, U2C and U2D are powered directly from the battery allowing direct control of the lower voltage power suppliers U2E and U2F are unused in this application.

First and second printed circuit contacts PB1, PB2 are positioned below an elastomeric keymat including the push buttons 30, 32. Push buttons 30, 32 can be designated with symbols "+" or "−", for example. When either push button 30 or push button 32 is pressed down by the user, the respective contact PB1 or PB2 is shorted using carbon pills. U2A and U2B along with nearby resistors and capacitors, R9, C20, C37 and R8, form a monostable timer. Input pin 1 to amplifier U2A is grounded, via D1 and D5. When either push button 30 or 32 is pressed, the 3.3 volt power supply is temporarily enabled via the signal SHDN provided at the output of U2C. With the 3.3V power supply enabled, power is provided to the microcontroller U3, via U4 and U12, to initiate the microcontroller U3. An initial task of microcontroller U3 is to assert the signal "ON" at pin 29 of the controller U3, which in turn keeps the main power supply unit active via Q2 which grounds the input of U2C setting the SHDN signal high, activating U4.

U2D along with R12 and R13 generate a voltage VB which is proportional to the battery supply. VB is measured by the microcontroller U3 to determine the condition of the battery.

Amplifier and Gain Control Circuit

Figure 5C:
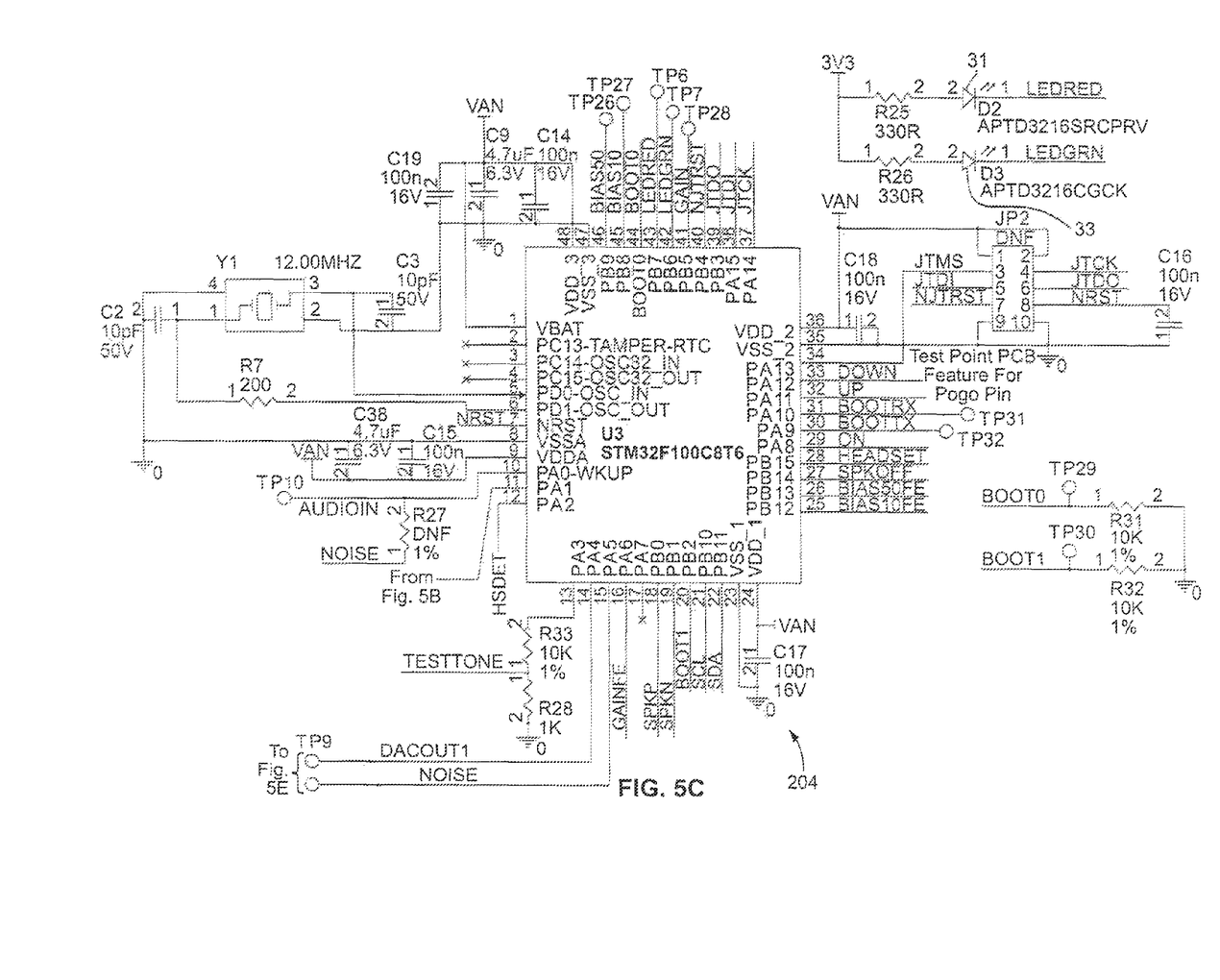
FIG. 5c is a detailed schematic of the controller portion of the circuit of an embodiment of the probe.
Figure 5D:
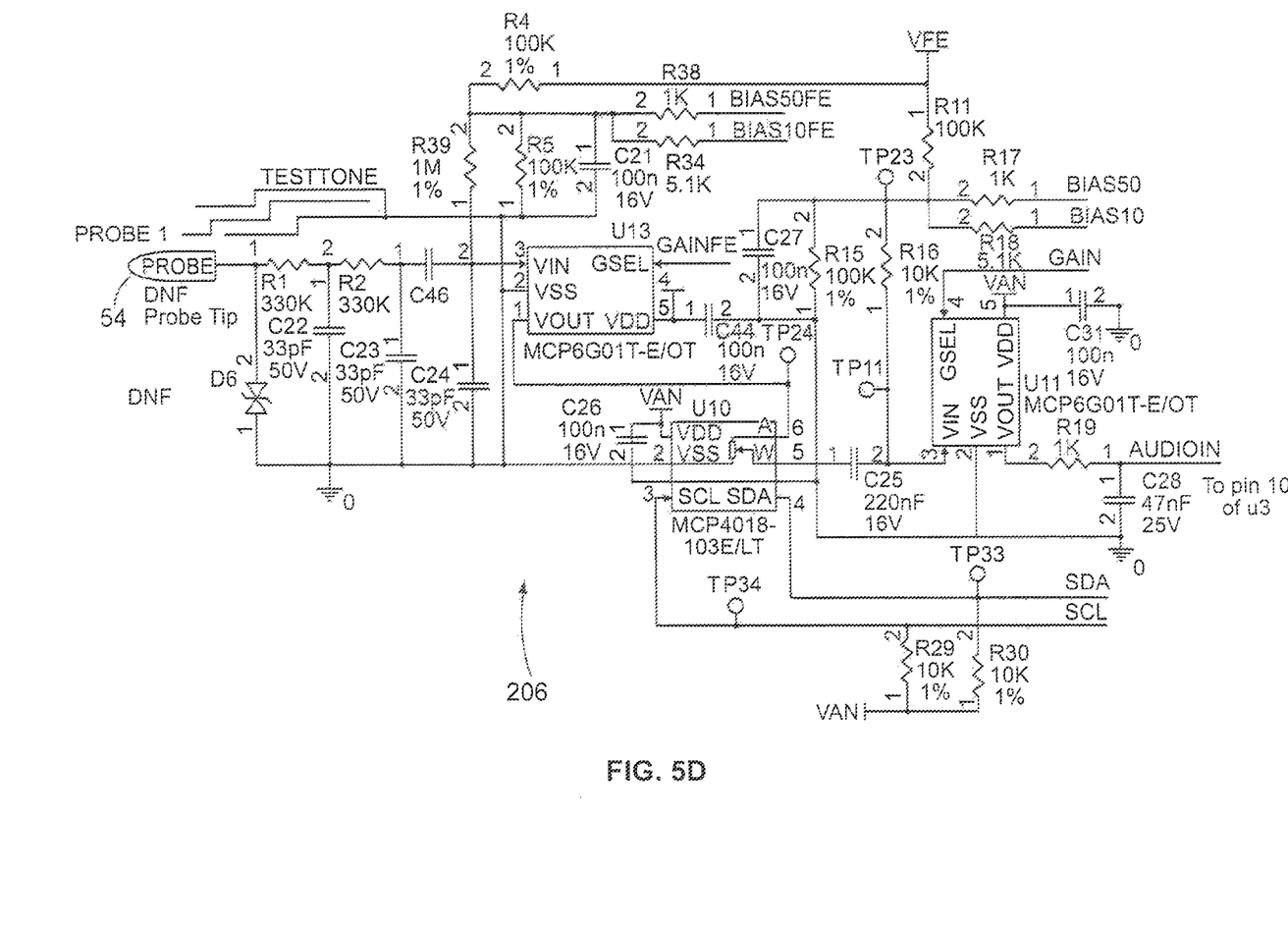
FIG. 5d is a detailed schematic of the signal processing portion of the circuit of an embodiment of the probe.

Details of the amplifier and gain control circuit 206 are illustrated in FIG. 5d. As noted above, the audio tone probe 20 operates by detecting and amplifying the electric field found proximate a conductor carrying an alternating voltage. An oscillator is used to generate the tracing tone signal and to apply the tracing tone signal to one or more wires. The probe 20 is an electrostatic field probe and is used at a remote point to detect the applied tracing tone signal thereby identifying the opposite end of the wire to which the tracing tone signal was applied. The probe tip 24 is in communication with the single conductor tip 54 of the PCB 50. As show in FIG. 5d, the tip 54 of the PCB 50 is electrically connected to the amplifier and gain control circuit 206.

The amplifier and gain control circuit 206 generally includes amplifiers U11 and U13; potentiometer U10; resistors R1, R2, R4, R5, R11, R15, R16, R17, R18, R19, R29, R30, R34, R38, and R39; capacitors C46, C21, C22, C23, C24, C25, C26, C27, C28, C3, and C46; and diode D6.

The power supply signal VAN from the power supply unit 200 is provided to pin 5 of each of the amplifiers U11, U13. First and second stage amplifiers U11 and U13 are preferably selectable gain amplifiers, for example, MCP6G01 amplifiers. The first stage amplifier U13 and the second stage amplifier U11 require a reference to determine if any voltage is present. The reference required by the amplifiers U13 and U11 is provided by the user's hand which is capacitively coupled to the circuit. VFE is used as a filtered source of voltage that is adjusted by the microcontroller U3 and fed to the input of each amplifier stage as a bias voltage adjusted to suit the currently selected gain setting of that amplifier to ensure that each amplifier's output is centered around the mid-point of VAN.

Resistors R1, and R2 and capacitor C46 couple the probe to the first stage amplifier U13. Resistors R1 and R2, and capacitor C46 provide a relatively high impedance path for the signals detected by the probe. These resistors reduce the risk of electrostatic damage to the probe should the probe be placed near a triboelectric charge of significant level. D6 can also be fitted to divert transient voltages to ground if required. Capacitor C46 acts in this embodiment as a high-pass filter to reduce the level of lower frequencies such as mains hum to prevent saturation of the input circuitry. Capacitors C22, C23 and C24 help to provide a low pass filter effect that reduces the response of the following circuitry to higher frequencies of no interest.

First stage amplifier U13 is a selectable gain amplifier that can be switched to gain settings of 1, 10 or 50. A single wire interface GAINFE between the microcontroller U3 and the first stage amplifier U13 is utilized to control the selectable gain amplifier by being set to one of three states, 0V, VAN or "high impedance".

The gain setting signal GAINFE is provided from pin 16 of the microcontroller U3 to pin 4 of the first stage amplifier U13 via a serial interface. Signal GAINFE adjusts the gain applied by the first stage amplifier U13 to the signal sensed by the tip 54. As GAINFE is adjusted, the signals BIAS50FE and BIAS10FE are changed from high-impedance to low as required to set the bias voltage at the input of U13 such that its output remains centered approximately at ½ VAN. Resistors R4, R5, R34, R38, R39 and capacitor C21 provide this biasing.

The signal which is amplified by the first stage amplifier U13 is provided as the output signal VOUT of U13. Output signal VOUT is then provided to the digitally controlled potentiometer U10. The potentiometer U10 can be for example a MCP4018 type potentiometer. The potentiometer U10 is under control of the microprocessor U3 via the serial interface SCL and SDA. The potentiometer U10 provides fine control of the attenuation of the amplified signal at VOUT of U13. The output signal of the potentiometer U10 is then coupled by C25 to the second stage amplifier U11.

The second stage amplifier U11 operates in the same manner as U13 but is independently controlled by the microcontroller U3 by signals GAIN, BIAS10 and BIAS50. Second stage amplifier U11 is a selectable gain amplifier that can be switched to gain settings of 1, 10 or 50. The gain setting signal GAIN is provided from pin 41 of the microcontroller U3 to pin 4 of the second stage amplifier U11. Signal GAIN adjusts the gain applied by the second stage amplifier U11 to the signal received from the potentiometer U10. As GAIN is adjusted, the signals BIAS50 and BIAS10 are changed from high-impedance to low as required to set the bias voltage at the input of U11 such that its output remains centered at approximately ½ VAN. Resistors R11, R15, R16, R17, R18 and capacitor C27 provide this biasing. When the signals BIAS 50 and BIAS 10 are not in use, the R17 and R18 respectively are provided as "open drains of the amplifier U11. Upon selection of the gain mode, the respective R17 or R18 is pulled to ground by the microcontroller U3.

The signal which is amplified by the second stage amplifier U11 is provided as the output signal VOUT of U11. The output VOUT of the second stage amplifier U11 is provided to a low pass filter provided by resistor R19 and capacitor C28, resulting in the filtered output signal AUDIOIN. The low pass filter provides additional filtering to remove more unwanted higher frequencies thereby reducing the risk of "aliasing" when sampled. Aliasing is the unwanted spectral folding that can occur when signals are present which are then sampled at a rate below double their own frequency. The signal AUDIOIN is sampled at a rate greater than 50 KHz and is provided to an analog-to-digital converter input of microcontroller U3.

The amplifiers U11, U13 and the attenuating potentiometer U10 are utilized therefore, to adjust the gain applied to the probe sensed signals and to achieve the signal AUDIOIN which is provided to the microcontroller U3. More specifically the gain of each amplifier U11, U13 and the attenuating potentiometer U10 is adjusted to control the gain applied to the probe sensed signals with a resolution of better than 1 dB through a range of approximately −20 dB to +62 dB. Typically, however, a range of 0 dB to +62 dB is utilized.

A TESTTONE signal provided by the controller circuit 204 is provided proximate the probe tip 54. The TESTTONE signal is sensed and processed in the same manner as other signals carried by the conductor proximate the probe tip 54. The TESTTONE signal is initiated in order to provide an indication as to the functionality of the probe 20.

Processor Circuit

Details of the processor circuit are illustrated in FIG. 5c. The processor circuit 204 of the circuit generally includes the microcontroller U3; frequency control crystal Y1; connector JP2; capacitors C2, C3, C9, C14, C15, C16, C17, C18, C19, C38; and resistors R28, R33, R7, R27, U3 is a highly integrated microcontroller, i.e. a self-contained microcomputer element that incorporates CPU, memories and peripherals into one package. Many types are available and capable of performing the processing necessary for this task. The recent availability of highly integrated microcontrollers having a reduced size, a reduced price and a reduced level of power-consumption makes the design and profitability of the probe feasible.

The detected signals from the output signal AUDIOIN of the amplifier and gain control circuit 206 is coupled to pin 10 of microcontroller U3. The signal AUDIOIN is sampled at a rate of 96 kHz before being "decimated" by 16 (averaged over 16 samples) to give an internal sample processing rate of 6 kHz and a theoretical "gain" of two bits resolution in the conversion. In this instance, we have approximately 14 bits of valid data for processing.

The data obtained from sampling the AUDIOIN signal is processed using digital signal processing (DSP) algorithms provided by the controller U3. Output signals, DACOUT1 and NOISE, are provided by the DSP algorithms. These outputs along with user intervention via the push-buttons 30, 32 are used to control the state of the device in terms of generation of audible and visual indications to the user. For example, DACOUT1 is provided at pin 14 of U3 and NOISE is provided at pin 15 of U3.

The microcontroller U3 can be fitted to the PCB in a "blank" form as delivered from its manufacturer and can then be programmed in-circuit utilizing the production test and programming connector JP2.

Light emitting diodes 31 and 33 are provided by D2 and D3. LEDs 31, 33 provide two visual indicators for various conditions. Diode D2 emits a red light and Diode D3 emits a green light. Diodes D2, D3 are powered from the 3.3V rail because the switching noise is not relevant to their operation. The microcontroller U3 controls the LEDs D2, D3 via signals provided at pins 42 and 63, turning the LEDs on and off using software control. Additionally, the brightness of the LEDs D2, D3 can be controlled by virtue of pulse width modulated signals provided by the microcontroller U3. In this manner, different color combinations of the LEDs D2, D3 can be utilized to indicate different states of the signal sensed by the probe 20 and the strength of the signal sensed by the probe 20 can be indicated by the brightness of the LEDs D2, D3.

Output Amplifier Circuit

Figure 5E:
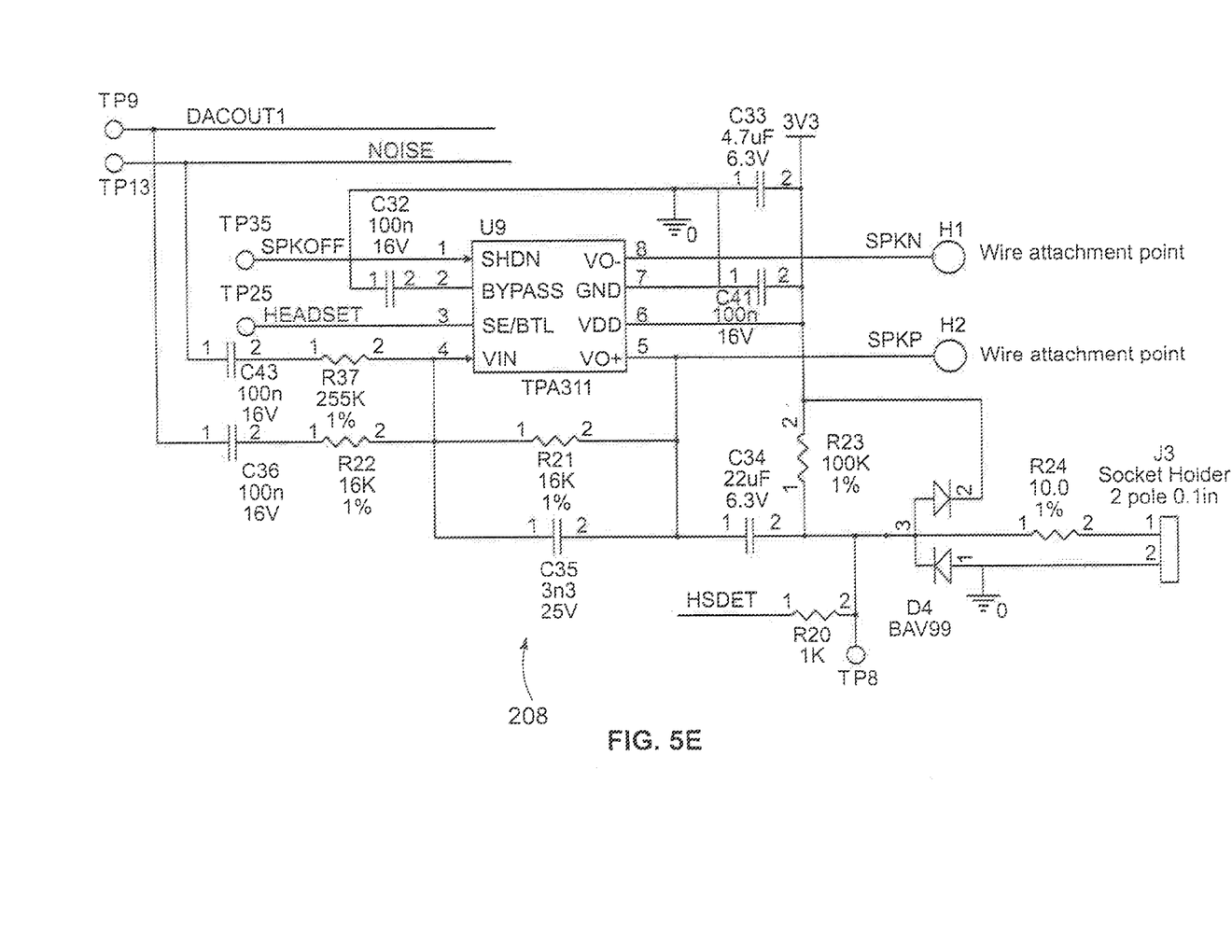
FIG. 5e is a detailed schematic of the amplifier portion of the circuit of an embodiment of the probe.

Details of the output amplifier circuit are illustrated in FIG. 5e. The output amplifier circuit includes an audio amplifier U9; capacitors C32, C33, C34, C35, C36, C41, C43; speaker terminals H1 and H2; and a socket J3. U9 is powered from the 3.3V rail because the switching noise is not relevant to its proper operation.

A mixer is formed by R22 and C36 along with R37 and C43 at the virtual earth of U9. The output signals DACOUT1 and NOISE of the microcontroller U3 are combined via the mixer and are provided to the amplifier U9. The ratio of NOISE to DACOUT1 is 1:16. In this way internally generated 16 bit audio data can be reproduced by the most-significant 12 bits being presented by DACOUT1 and the least significant four bits as the lower four bits of NOISE.

The amplifier U9 provides a means of amplifying the mixed audio output signals (i.e. DACOUT1 and NOISE) from the microcontroller U3. The amplified signals are provided to terminals H1 and H2 of the loudspeaker 84 and optionally via C34, R24 and J3 to the headset socket 38. R23 pulls-up the node where the headset will connect while R20 allows the voltage at this node to be monitored by the microcontroller U3. Because the headset will have a much lower impedance than R23 this node will be pulled to near zero volts when a headset is inserted in the headset socket 38 allowing the microcontroller U3 to distinguish this condition. The microcontroller U3 provides the signal HEADSET to pin 3 of U9 to switch off the loudspeaker and to provide audio only to the headset attached to terminal J3 when this condition is detected. A signal SPKOFF provided at pin 27 of microcontroller U3 is provided to pin 1 of microcontroller U9 to enable or disable the audio power amplifier portion 208 of the circuit 60. Diode D4 provides some additional protection to microcontroller U3 and microcontroller U9 from electrostatic discharge that may occur to the headset socket J3.

Figure 6:
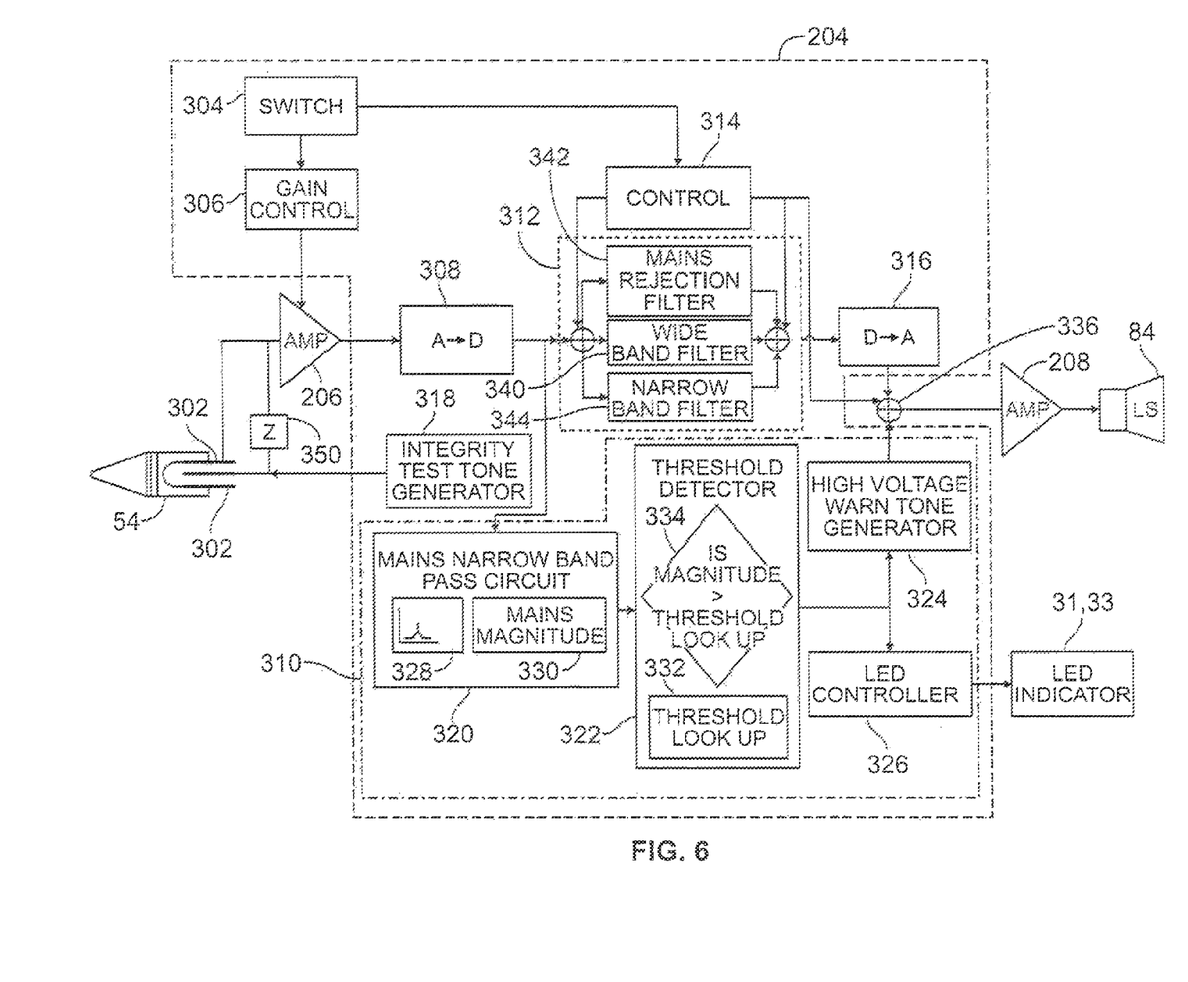
FIG. 6 is a block diagram of the logic provided by the controller portion of the circuit of an embodiment of the probe.

FIG. 6 illustrates a block diagram of the signal processing provided by the processor circuit 204 of the probe 20. As illustrated in FIG. 6, the circuitry 60 of the probe 20 includes copper track 302, which provides an electrical connection between the tip 54 of the PCB 50 and the circuitry 60 of the PCB 50. Electromagnetic signals present in the electrostatic field detected by the tip 54 are provided to the amplifier and gain control circuit 206 via the copper track 302.

Signal processing provided by the processor circuit 204 includes, a mode switch 304, a gain control 306, an analog-to-digital converter 308, a mains warning circuit 310, a tracing circuit 312, a tracing mode control 314, a digital-to-analog converter 316, and an integrity test circuit 318.

The mode switch 304 is utilized to select the setting of the gain control 306 to determine the level of gain to be applied to the signals detected by the probe tip 54. The analog signals detected by the tip 54 are provided to the amplifier and gain control circuit 206, which amplifies the detected analog signals according to the applied gain setting. The amplified analog signal is then digitized by the analog-to-digital convertor 308 of the processor circuit 204 and provided to the mains warning circuitry 74.

The mains warning circuit 310. The mains warning circuit 310 generally includes a mains narrow band pass circuit 320, a threshold detector 322, a warning tone generator 324 and a LED controller 326. The mains narrow band pass circuit 320 includes a narrow band pass filter 328 and a magnitude calculator 330. The narrow band pass filter 328 distinguishes mains signal detected by the probe tip 54 from other audio signals detected by the probe tip 54. The mains signal is then provided to the mains magnitude calculator 300 which calculates the magnitude of the detected mains signal. The magnitude of the mains signal is then passed to a mains threshold detector 322.

The threshold detector 322 generally includes a threshold look-up table 332 and a mains magnitude comparison circuit 334. The threshold look-up table 332 contains the threshold of the mains signal associated with each gain setting of the amplifier and gain control circuit 206. Once the threshold for the mains signal associated with the selected gain setting is determined, the comparison circuit 334 compares the determined threshold with the calculated mains magnitude. If the calculated mains magnitude is greater than the determined threshold, the detected signal is designated as potentially hazardous. In response, the LED controller 326 is triggered and the LEDs 31, 33 are illuminated to provide a visual alert to the user. In addition, upon designation of the detected signal as potentially dangerous, the warn tone generator 324 generates a signal having a designated warning sound. This warning sound is provided to the mixer 336 of the output amplifier circuit 208 where it is amplified and provided to the loud speaker 84. The user therefore receives an audible warning via the loud speaker 84 along with a visual warning via the LED 31, 33 of the potentially hazardous voltages on the conductors. Thus, the mains warning circuit does not pass any detected mains signal to the output amplifier circuit, but rather simply passes an indication that the mains signal is present on the conductor to the output amplifier circuit 208.

In addition to providing the detected signals to the mains warning circuit 310, the amplified detected signals are provided to the tracing circuit 312. The tracing circuit 312 includes a wideband filter 340, a mains rejection filter 342, and a narrow band filter 344. The control 314 is used to determine which filter 340, 342, 344 is to be applied to the amplified detected signals received from the analog-to-digital converter 308. The wideband filter 340 provides for passage of all signals within the range of approximately 200 Hz to 3 KHz from the analog-to-digital converter 308 to the digital-to-analog converter 316 with the exception that signals at approximately the fundamental frequency of the mains signal are rejected. The mains rejection filter 342 provides for the passage of all signals within the range of approximately 200 Hz to 3 KHz from the analog-to-digital converter 308 to the digital-to-analog converter 316 with the exception that signals at approximately the fundamental frequency of the mains signal and harmonics of the fundamental frequency are rejected. A comb filter such as the one described in U.S. Pat. No. 5,557,099 may be used to reject the harmonics of the mains frequency. The narrow band filter 344 is designed to allow for passage of certain selected frequencies, from the analog-to-digital converter 308 to the digital-to-analog converter 316. For example, the narrow band filter 344 is configured to allow for passage of only the tracing tone signal. Thus, regardless of the filter 340, 342, 344 the tracing circuit 312 does not pass mains signals to the digital to analog converter 316.

The integrity test tone generator 318 generates an integrity test tone signal which is coupled to the amplifier and gain control circuit 206 via impedance 350. Impedance 350 represents the impedance between copper tracks 302. The integrity test tone generator is activated for a short time for every power ON of the probe in the present invention. When activated, the integrity tone generator 318 generates a test tone signal within audio range (200 Hz-3 KHz) which is coupled to the amplifier via impedance 350 and is amplified by the amplifier and processed by the processor 204 in the same manner as any other electromagnetic signals in proximity to the probe tip are detected by the probe tip 54. Thus, test tone signal within audio range (200 Hz-3 KHz) becomes audible at the loudspeaker, proving the signal chain from the probe tip 54 to the speaker 84 via amplifier and gain control circuit 206, analog-to-digital converter 308 of the processor 204, tracing circuit 312 of the processor 204, and digital-to-analog converter 316 of the processor 204, to confirm that the probe 20 is operational. Alternatively, in another embodiment of the invention, the integrity test tone generator 318 is configured to generate a test tone signal having the same frequency as the mains signal. When activated, the integrity tone generator 318 generates the mains frequency test tone signal which is coupled to the amplifier via impedance 350 and is amplified by the amplifier and processed by the processor 204 in the same manner as any other electromagnetic signals in proximity to the probe tip are detected by the probe tip 54. Thus, the mains narrow band pass circuit 310 will identify the mains frequency test tone signal and in turn activate the mains warn tone generator to confirm operation of the probe 20.

Operation of the Probe

Initiating Power and Test Tone

In operation, a user (not shown) powers on the audio tone probe by pressing a designated push button(s) 30, 32. Depending upon the configuration of the processor 204, either or both push buttons may be utilized to power the probe 20 on and off. Upon pressing the designated button(s) 30, 32, power is provided to the probe 20. As noted above, when the probe 20 is initialized, the probe is placed in a default mode. Next, the microcontroller U3 starts operation and validates the key press. After a short delay, a user interface tone and flash of the LEDs 31, 33 indicates to the user that the probe is now operating. A short while later, the test tone generator 318 is initiated by the microcontroller U3 and an integrity test tone, designated TESTTONE is provided via the resistors R33 and R28 at pin 13 of the microcontroller U3. The integrity test tone signal is provided to the amplifier and gain control circuit 206 of the circuit 60. The duration of the test tone signal can be, for example, 0.5 seconds. The test tone signal is amplified via the amplifiers U13, U11 and the output AUDIOIN of the amplifier and gain control circuit 206 is provided to the microcontroller U3 where it is converted to a digital signal and provided to the tracing circuit 312. In the default mode, the wide band circuit 340 of the tracing circuit 312 is active. Thus, the test tone signal which is in the audible range 200 Hz-3 KHz) will be passed to the digital-to-analog converter 316 and converted to an analog signal. The analog output signal DACOUT is provided to the loud speaker 84 via speaker attachments H1 and H2 of the output amplifier circuit 208 to provide an audible tone to notify the user that the circuitry is powered up and operational.

Gain Control

The user may adjust the gain of the probe by momentary operation of the "+" or "−" push buttons 30, 32. When the microcontroller 204 identifies a valid button press it will internally increment a reference register for the gain setting. Subsequently the microcontroller 204 will alter the combination of the amplifier and gain control stage 206 by adjusting the state of the lines GAIN and GAINFE controlling U13 and U11 respectively. In the embodiment described, setting the relevant line GAIN or GAINFE to be zero, supply voltage, or high-impedance results in a gain selection of 10, 50 or 1 times respectively.

Fine control of the steps of gain can be made using the attenuator formed by U10 which is also controlled by the microcontroller 204 via signals SDA and SCL. To ensure correct bias of the amplifiers U13 and U11, the DC voltage present at each input must be adjusted to suit the currently selected gain for each amplifier. These are controlled via the potential dividers optionally set to ground via the control lines BIAS10, BIAS50 and BIAS10FE, BIAS50FE.

For most applications between six and ten different gain settings may be made available to the user though further resolution is possible if needed. Each gain setting would differ from the previous by approximately 6 to 10 decibels.

Selecting a Mode of Filtration

Next, the user may select mode of operation for the probe 20. The user may select wide band filtration (default at switch-on) provided by the wide band filter 340, mains rejection filtration provided by the mains rejection filter 342, or narrowband filtration provided by the narrow band filter 344. The mode of operation may be selected by repeated pressing of the buttons 30, 32 together. Different modes of operation are indicated to the user by sequences of short beeps and different flashes of the LEDs 31, 33.

Sensing a Signal Present on the Conductor

The user then positions the tip 54 of the probe 20 proximate the conductor of interest. The tip senses the electromagnetic field including the applied tracing tone signal present on the conductor. Due to the connection between the tip 54 and the amplifier and gain control circuit 206 via the copper traces 302, any signal present in the electromagnetic field sensed by the tip 54 is passed to the amplifier and gain control circuit 206 of the circuit 60. The selected mode of filtration 340, 342, 344 is applied by the tracing circuit to the detected signal. The filtered signal is then provided to the digital-to-analog converter 316 of the processor circuit 204. The analog signal is then passed to the output amplifier portion 208 of the circuit 60.

Warning of Hazardous Conditions

Irrespective of the filtration mode 340, 342, 344 selected by the user, the digitized signal which is provided to the tracing circuit 312 is also passed to the mains warning circuit 310. The mains warning circuit 310 is provided by processor circuit 304 and algorithms operating within the microcontroller U3. If the mains warning circuitry 310 determines that hazardous voltages are present on the conductor which is proximate the tip 54 of the probe, a specific warning tone and warning light sequence are initiated by the controller U3. In particular, a hazardous warning tone is provided by the high voltage warn tone generator 324 and provided to the output amplifier circuit 208 of the circuit 60. In addition, the LED controller 326 of processor circuit 204 provides a signal to the LEDs 31, 33. Thus, audio and visual warnings of the hazardous condition are provided to the user.

Silencing the Hazardous Warning

While probing for the applied tracing tone, if a desired conductor is very close to a hazardous conductor the triggered warning tone can make it difficult for the user to trace the desired conductor. Upon entry of a specific key sequence by the user using the push buttons 30, 32, a control signal SPKOFF is provided to the output amplifier circuit 208 to mute the warning tone provided by the ward tone generator. Despite muting of the warn tone provided by the warn tone generator 324, signals provided by the digital-to-analog convertor 316 continue to be provided to the output amplifier circuit 208. With the warning tone muted, the user can more easily locate the desired conductor carrying the applied tracing tone. Despite muting of the audible warning tone, the user will continue to receive a visual warning of any hazardous conditions via the LEDs 31, 33.

Use of the audio tone probe 20 provides the user with audio and visual warnings of hazardous voltages near the tip of the conductor while the user is performing a trace of the conductor. Thus, conductors can be identified with added safety due to the reduced risk of electrical shock hazard even in environments where other nearby conductors carry hazardous voltages. The finger guard 28 is provided to discourage users from placing their fingers near the tip 24 which may result in contact with the indicated hazardous voltage. The probe 20 is rated for direct electrical contact only with telecommunications network voltages, not mains voltages. Touching the tip 24 will "short" the high-impedance input drastically reducing sensitivity to all signals which is also undesirable. The circuit provides an indication of possibly hazardousness signals on the conductors irrespective of the filtration mode selected, gain being set, etc. Thus, this invention provides added improved safety to the user as compared to the presently available conventional tone probes.

Although numerous elements of the circuit illustrated in FIGS. 5a-5e including "reservoir" and "decoupling" capacitors are distributed around the circuit 60 and have not been described. It is understood that the purpose and function of these elements is understood by one skilled in the art.

The present invention may be used more generally in a number of different analog/digital signal processing applications where presence of hazardous signal is to be warned while processing other audio signals of interest. The present invention may, in part or in whole, be implemented using discrete semiconductors, digital signal processing (DSP) IC chips, programmable system on chip (PSOC) IC chips on which one or more analog-to-digital convertors 308 or digital-to-analog convertors 316, amplifiers 206, 208 etc., are inbuilt or externally employed, with power supply, memory, etc., and suitably positioned for interfacing to the probe tip 54. It is considered that the person having ordinary skill in the art could engineer these modification to the invention. Therefore, the details of implementing the foregoing aspects of the invention using any of the above will not be described in further detail herein.

Figure 7:
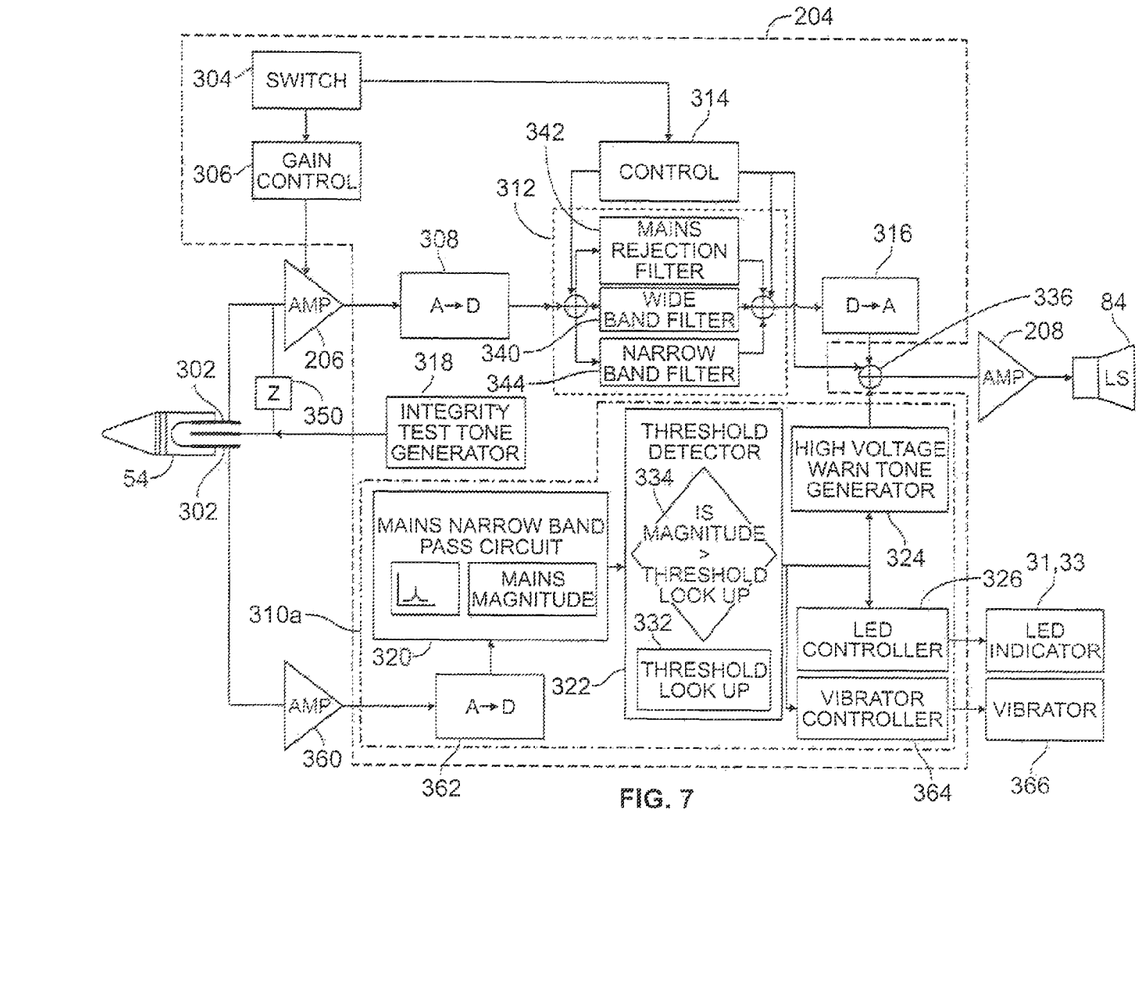
FIG. 7 is a block diagram of an alternate embodiment of the logic provided by the controller portion of the circuit and which provides an earlier separation between the path for the "mains" signal and the audio signal by providing separate input amplifiers and therefore does not require adjustment of gain.

A second embodiment of the circuit of the probe is illustrated in FIG. 7. The circuit of FIG. 7 is similar to the circuit of FIG. 6 except as described herein. The amplifier and gain control circuit 206 includes an analog gain amplifier 360 and the mains detection circuit 310a of the processor 204 includes an analog-to-digital convertor 362 and a vibrator controller 364. The circuit of FIG. 7 provides for separation of a tracing circuit path from a mains detection path. The signal provided to the mains detection path is provided to the constant analog gain amplifier 360 and to the analog-to-digital convertor 362 of the mains warning circuit 310a.

The digital signal provided by the analog-to-digital converter 362 is passed to the mains narrow band pass filter circuit 320, which filters out mains signal from other audio signals and calculates the magnitude of the mains signal. The magnitude of the mains signal is then passed to the threshold detector 322. If the detected signal is designated as potentially hazardous the warn tone generator 324, LED controller 326, and the vibrator controller 364 are triggered. The LED controller 326 controls the LEDs 31, 33 to provide a visual alert to the user and the vibrator controller 364 controls the vibrator 366 to cause the probe 20 to vibrate providing a sensual warning along with visual and audible warnings of the potentially hazardous voltages on the conductors.

Figure 8:
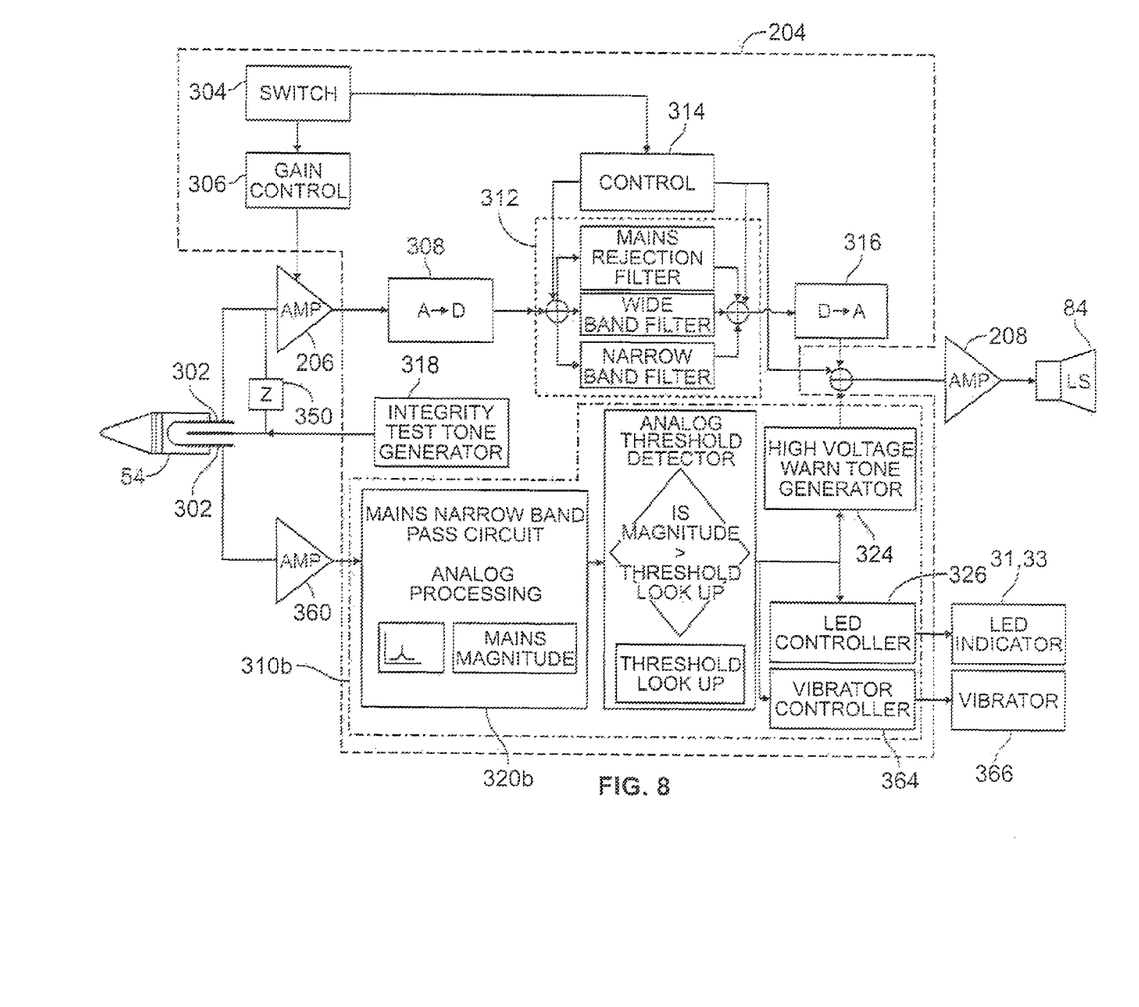
FIG. 8 is a block diagram of an alternate embodiment of the logic provided by the controller portion of the circuit and which provides a common input amplifier and analog processing for "mains" signal.

A third embodiment of the probe is illustrated in FIG. 8. Similar to the mains warning circuit 310a of the circuit of FIG. 7, the amplifier and gain control circuit 206 includes an analog gain amplifier 360 and the mains detection circuit 310b of FIG. 8 includes a vibrator controller 364. The circuit of FIG. 8 provides for separation of a tracing circuit path from a mains detection path. The signal provided to the mains detection path is provided to the constant analog gain amplifier 360. As shown in FIG. 8, however, the mains narrow band detector 320b is realized by analog circuitry.

Figure 9:
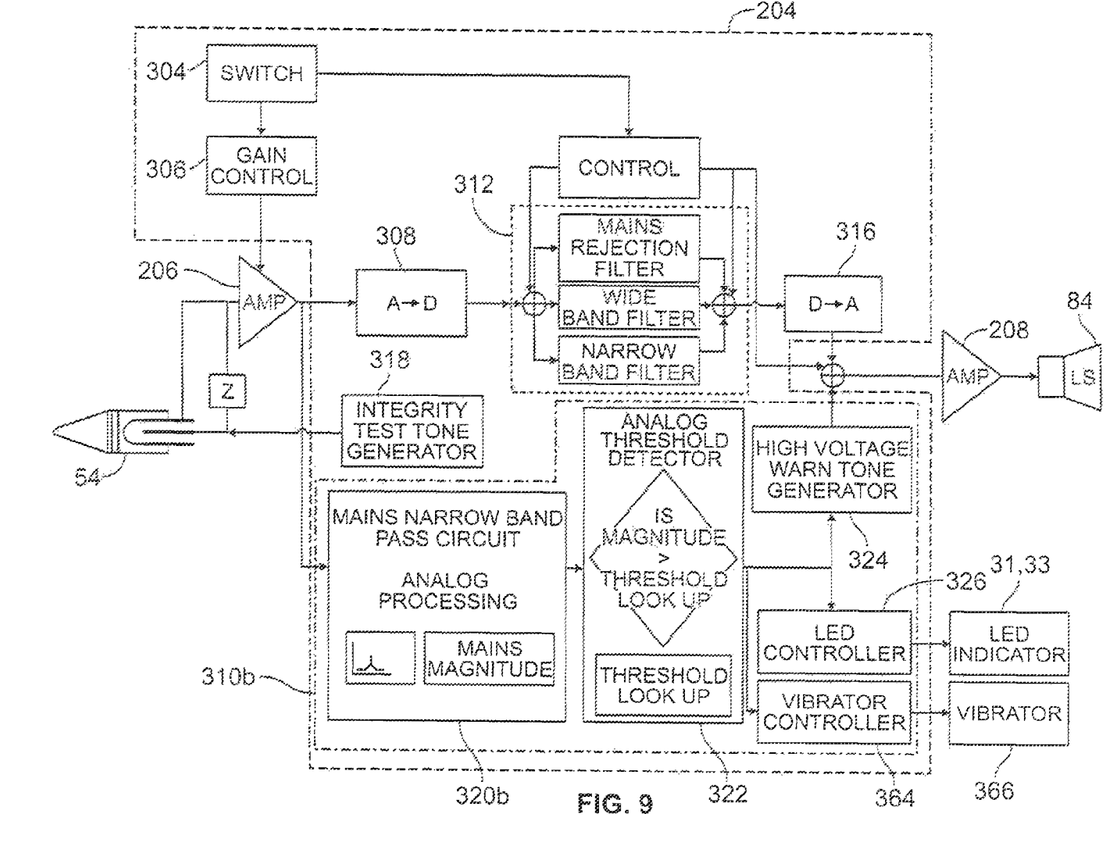
FIG. 9 is a block diagram of an alternate embodiment of the logic provided by the controller portion of the circuit and which provides separate input amplifiers and analog processing for "mains" signal.

A fourth embodiment of the probe is illustrated in FIG. 9. As shown in FIG. 9, the mains narrow band detector 320c is fed by the analog audio amplifier 206. As with the circuit of FIG. 8, the mains narrow band detector 320b is realized by analog circuitry. In addition, upon detection of potentially hazardous voltages, the vibrator controller 364 activates a vibrator 3665 to provide an additional method of warning the user of the potentially hazardous voltages.

While particular forms of the invention have been illustrated and described, it will be apparent that various modifications can be made without departing from the spirit and scope of the invention. Accordingly, it is not intended that the invention be limited except by the following claims.

We claim:

1. An audio tone probe for use by a technician to identify a conductor carrying an applied tracing tone signal comprising:
    a probe tip, to be positioned by the technician proximate a conductor;
    a mains warning circuit in electrical communication with said probe tip, said mains warning circuit including a mains warning generator;
    a tracing circuit in electrical communication with said probe tip;
    a speaker for providing audio tones to the technician in communication with said mains warning circuit and said tracing circuit;
    wherein said probe tip detects signals in an electric field proximate said probe tip and provides said detected signals to said mains warning circuit and said tracing circuit;
    wherein said mains warning circuit is configured to determine whether a mains signal is present in said detected signal and to activate a warning generator if said mains signal is present; and
    wherein said tracing circuit is configured to filter mains signals from said detected signals and an output of said tracing circuit is utilized to provide a tone generating signal to said speaker to reproduce the applied tracing tone.

2. The audio tone probe of claim 1, wherein said mains warning circuit includes a mains narrow band pass filter.

3. The audio tone probe of claim 1, wherein said mains warning circuit includes a mains magnitude detector for determining a magnitude of said detected mains signal.

4. The audio tone probe of claim 3, wherein said mains warning circuit further comprises a threshold detector, wherein said threshold detector determines an applicable threshold and compares said determined magnitude of said mains signal to said applicable threshold; and
    wherein activation of said warning generator occurs when said determined magnitude of said mains signal exceeds said determined applicable threshold.

5. The audio tone probe of claim 1, wherein said mains warning circuit includes an LED controller and an LED indicator, and wherein activation of said warning generator includes controlling said LED indicator via said LED controller.

6. The audio tone probe of claim 1, wherein said mains warning circuit includes an vibrator controller and a vibrator, and wherein activation of said warning generator includes controlling said vibrator via said vibrator controller.

7. The audio tone probe of claim 1, further comprising a warn tone generator and wherein activation of said warning generator includes providing a warning tone to said speaker.

8. The audio tone probe of claim 1, wherein said tracing circuit is further configured to reject harmonics of the mains signal.

9. The audio tone probe of claim 1, wherein said tracing circuit is further configured to pass only signals of a specified frequency.

10. The audio tone probe of claim 9, wherein said specified frequency is the frequency of the applied tracing tone.

11. The audio tone probe of claim 1, further comprising an amplifier circuit and wherein said detected signals are amplified prior to providing said detected signals to said mains warning circuit and said tracing circuit.

12. The audio tone probe of claim 1, wherein said detected signals are digitized before being provided to said mains warning circuit.

13. The audio tone probe of claim 1, wherein said detected signals are digitized before being provided to said tracing circuit.

14. The audio tone probe of claim 1, wherein said output of said tracing circuit is converted from analog to digital prior to being provided to said speaker.

15. The audio tone probe of claim 14, wherein said digital signal is amplified prior to being amplified by said speaker.

16. The audio tone probe of claim 1, further comprising an integrity test circuit, wherein said integrity test circuit generates a test signal having a frequency in the audible range which is sensed by said probe tip and provided to said loud speaker via said tracing circuit to confirm that the probe is operational.

17. The audio tone probe of claim 1, further comprising an integrity test circuit, wherein said integrity test circuit generates a test signal having a mains frequency which is sensed by said probe tip and provided to said loud speaker via said mains warning circuit to confirm that the probe is operational.

18. The audio tone probe of claim 11, wherein said amplifier circuit includes a first stage amplifier and a second stage amplifier.

19. The audio tone probe of claim 18, wherein said amplifier circuit further includes a potentiometer and wherein an output of said first stage amplifier is provided to said potentiometer and an output of said potentiometer is provided to said second stage amplifier.

20. The audio tone probe of claim 1, wherein the mains warning circuit and the tracing circuit both connect with the probe tip.

* * * * *